DUPLEX STATION EMPLOYING A REFLEX TRAVELING WAVE AMPLIFIER AND FREQUENCY CONVERSION

Filed May 1, 1959

INVENTORS D. A. ALSBERG
E. C. DENTON

BY Arthur J. Torsiglieri
ATTORNEY

United States Patent Office 3,045,235
Patented July 17, 1962

3,045,235

DUPLEX STATION EMPLOYING A REFLEX TRAVELING WAVE AMPLIFIER AND FREQUENCY CONVERSION

Dietrich A. Alsberg, Berkeley Heights, and Eugene C. Denton, Morris Plains, N.J., assignors to Bell Telephone Laboratories, Incorporated, New York, N.Y., a corporation of New York Filed May 1, 1959, Ser. No. 810,505
6 Claims. (Cl. 343—180)

Figure 1:
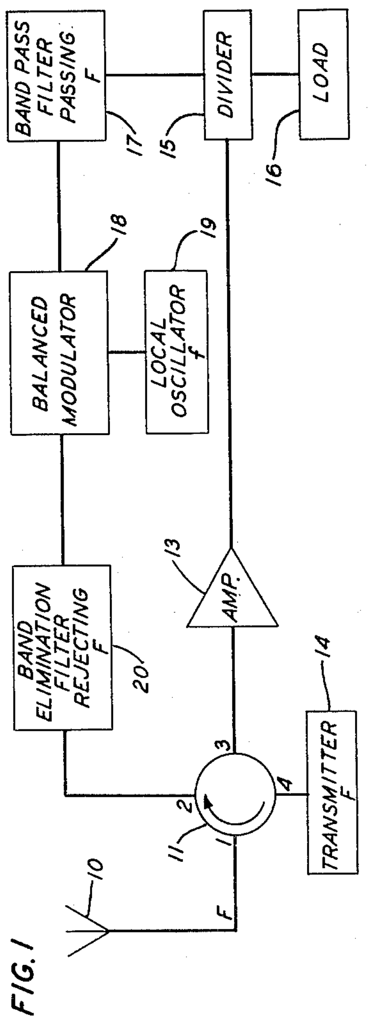

This invention relates to high frequency amplifiers.

An object of the invention is an amplifier which is capable of handling a wide dynamic range of input levels.

To this end, the invention provides an improved form of reflex amplifier.

The general principles of reflex-type amplifiers are described in United States Patent 2,674,692 to C. C. Cutler. Such amplifiers utilize to advantage the broad band amplifying characteristics of presently available amplifying tubes, such as traveling wave tubes, to increase the stable gain obtainable with such a tube. In particular, in such amplifiers the signal is made to traverse the amplifying tube a plurality of times, for example, twice, the signal being shifted in frequency after each traversal so that the subsequent traversal will be at a different frequency whereby further amplification can be obtained with a minimum risk of instability. For this purpose, there is provided a feedback path where this frequency conversion is effected.

An object of the invention is an improved amplifier of this kind, capable of handling a wider dynamic range of input levels.

Previous forms of reflex amplifiers in which only energy of the converted frequency is permitted to reach the load have been limited in this respect because, when designed to provide adequate sensitivity for handling low level input signals, high level input signals tend to cause overloading of the amplifying element in the first traversal of the signal therethrough with the consequence that little energy at the converted frequency passes through and reaches the load.

To this end, a related object is to insure a useful output signal despite overloading of the amplifying element in the first traversal of the signal therethrough. This adapts the amplifier to use in applications where the input signal has a wide dynamic range. This end is achieved in accordance with one feature of the invention by abstracting from the feedback path some energy of the original frequency for application to the load. The entry into the feedback path of power of the converted frequencies is minimized by insertion in the feedback path of a suitably tuned filter.

Another object of the invention is an increase in efficiency in reflex amplifiers. This is achieved in accordance with another feature of the invention by providing for the amplification of both upper and lower sidebands of the frequency conversion products on the second traversal of the amplifying element and supplying energy at all such sidebands to the load.

Another object is to relax the stability requirements of the local oscillator employed for frequency conversion. This is achieved in accordance with another feature of the invention by employing a feedback loop which avoids filtering of the frequency conversion products.

Another object is to reduce the number and variety of the components needed in the feedback loop. This is achieved in accordance with another feature by an arrangement which permits each filter to serve a variety of roles.

In a preferred embodiment of the invention, the input signal is supplied to the first port of a circulator of which the second and third ports connect to the output connection of the feedback path and the input end of a traveling wave tube, respectively. The output connection of the traveling wave tube is supplied to the input connection of a power dividing arrangement, one output terminal of which forms the input connection to the feedback path and another output terminal supplies the load. The feedback path includes in turn a filter tuned to pass the unconverted signal but to reject the frequency conversion products, a balanced modulator supplied by a local oscillator for effecting the desired frequency conversion, and a filter tuned to reject the unconverted signal but to pass the frequency conversion products.

Various other embodiments will be discussed.

Figure 2:
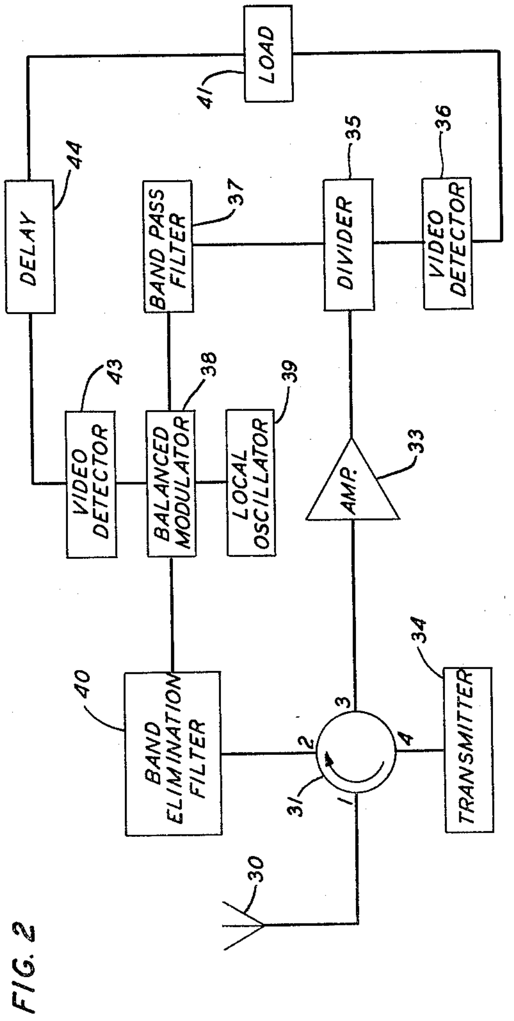

The invention will be better understood from the following more detailed description taken in conjunction with the accompanying drawing of which each of FIGS. 1 and 2 shows in block schematic form a radar which includes a reflex amplifier in accordance with a separate embodiment of the invention.

Each of the components depicted in block form relates to a function for which apparatus is well known in the art so it is believed unnecessary to provide detailed descriptions thereof.

With reference now more particularly to the drawing, in FIG. 1 the radar arrangement includes an antenna 10 which picks up the input signal to be amplified and supplies this input signal of frequency F to the first port of the circulator 11. The second port of this circulator is connected to the output end of the feedback path of the reflex amplifier. The third port of the circulator leads to the input connection of the amplifying element 13, typically a traveling wave tube. In order that the antenna 10 may also be used to transmit the search or transpond pulses, the fourth port of the circulator is connected to a transmitter 14 which periodically supplies pulses of frequency F, or some other frequency in case of a transponder system, for radiation by the antenna. Actually, the pulse typically comprises a band of frequencies centered about the frequency F as a result of video frequency modulation. The output of the amplifying element 13 is supplied to the input end of a power dividing arrangement for division between the pair of output connections of which one leads to the load 16, which typically comprises a detector and video amplifier, and the other leads to the input connection of the feedback path. The feedback path comprises from its input to output ends a bandpass filter 17, a balanced modulator 18 to which is also supplied the output of frequency $f$ of the local oscillator 19, and the band elimination filter 20. The bandpass filter 17 is tuned to pass signals of frequency F but to reject the frequency conversion products to be amplified on the second traversal of the amplifying element. The band elimination filter 20 conversely is tuned to pass the frequency conversion products to be amplified. Generally, it is sufficient that the principal upper and lower sidebands, $F+f$ and $F-f$, of the frequency conversion products be amplified in the second traversal of the amplifying element, though in some cases it may be desirable to amplify only the upper ($F+f$, $F+2f$ . . .) or lower ($F-f$, $F-2f$ . . .) sidebands.

In operation, the signal of frequency F received by the antenna enters the first port of the circulator and exits from the second port. After exiting, it is reflected by the filter 20 back into the second port of the circulator and thereafter exits from the third port and passes on to the amplifying element 13. After amplification, the signal is supplied to the power divider arrangement 15 where it divides, part of its energy being supplied to the load and the remainder passing through the filter 17 to the balanced modulator 18. There the signal undergoes the desired frequency conversion. The balanced modulator 18 is designed to generate and pass on both the upper and lower sidebands. These frequency conversion products pass through the filter 20 and enter the second port of the circulator, exiting from the third port for application to the amplifying element. The amplifying element is designed to have a frequency range of useful application which encompasses both upper and lower sideband frequencies in addition to the original frequency. It is this consideration which makes use of a traveling wave amplifier with its broad band characteristics especially advantageous. After amplification, the frequency conversion products are supplied to the power dividing arrangement 15 where the energy divides, a portion being supplied to the load and the remainder being dissipated by the action of the filter 17 which prevents the frequency conversion products from passing into the feedback path and reaching the modulator 18.

From the role discussed for it, it can be appreciated that the power dividing arrangement can be simply a hybrid junction of the kind that divides input energy supplied to it between two output connections in a desired way, for example, equally. Such an arrangement has the advantage of simplicity but a disadvantage that a significant portion of the energy of the frequency conversion products will be lost. To avoid this loss, it is possible to design the power dividing arrangement to provide that substantially all of the energy of the frequency conversion products is applied to the load.

It has been helpful to a clear description of the invention to show a separate element or block for performing each of the required operations. In many instances, it will be feasible to consolidate several operations in a composite element. For example, the function of the bandpass filter 17 can be incorporated into the power dividing arrangement 15 or alternatively the function of the band elimination filter can be incorporated into the circulator 11. Accordingly, it is to be understood that the breakdown of the essential operations into the role of discrete elements is for purposes of exposition and that integration of two or more such operations in a composite device is within the spirit and scope of the arrangement described.

Various advantages result from the arrangement described.

First, by providing that energy of the original frequency F is supplied to the load as well as energy of the sideband frequencies, protection is provided for the situation in which the level of the signal of freqeuncy F supplied to the amplifying element 13 is so high that the element overloads and so becomes incapable of amplifying the frequency conversion products. The presence of the original frequency signal in the detector will not be detrimental since the detector can readily be made to respond to the signal of highest level. Moreover, by this expedient, even if the local oscillator 19 should fail completely, the radar will still perform although at a reduced gain inasmuch as amplified energy of the original frequency will still reach the load.

The amplification of both upper and low frequency conversion products generally results in an increase in the efficency of operation of the traveling wave tube and an increased output level to the load. Moreover, although the discussion has emphasized the upper and lower sidebands, $F+f$ and $F-f$, all of the frequency conversion products coming within the passband of the amplifying element can be utilized.

Preselection of the frequency of the energy permitted to pass into the amplifying element is achieved by the use in the specific way described of the circulator and band rejection filter.

Radio frequency noise band limiting is achieved by the presence of the bandpass filter in the feedback loop.

The presence in the feedback loop only of filters tuned to the original frequency, i.e. the absence of any filters tuned to any of the frequency conversion products, permits an extremely broad tolerance in the frequency stability of the local oscillator.

Moreover, the use of the circulator readily adapts the receiver for use with a transmitter in a transponding arrangement as shown.

It should be obvious that many of the features described have independent utility so that it is unnecessary to include all simultaneously in a particular arrangement.

For example, it is feasible to apply the output of the amplifying element to a power dividing arrangement which is frequency selective such that substantially all of the energy of the original signal frequency is supplied to the input end of the feedback path while substantially all of the energy of the frequency conversion products is supplied to the load.

Alternatively, modifications in the feedback arrangement are feasible. For example, substitution of a bandpass filter tuned to pass only a selected sideband of the frequency conversion products can be substituted for the band elimination filter 20 whereby only this selected sideband will be amplified in the second traversal of the signal through the amplifying element.

FIG. 2 shows an alternate arrangement for insuring a useful output despite overloading of the amplifier in the traversal of the original frequency signal. In most respects this arrangement resembles that shown in FIG. 1. Antenna 30 supplies the first part of the circulator 31, the second part of which is connected to the output end of the feedback path of the reflex amplifier, the third part of which supplies the input of the traveling wave amplifier 33, and the fourth part of which is connected to the transmitter 34. The output of the traveling wave tube amplifier is supplied to the divider 35 which is designed to pass energy of the original frequency into the feedback path by way of the bandpass filter 37, whose passband is centered at the original frequency but which rejects the frequency conversion products, and to pass energy of the frequency conversion products on to the video detector 36 for detection and application to the load 41. The feedback path includes the balanced modulator 38 to which is supplied both energy from the local oscillator 39 and energy of the original frequency passed by the bandpass filter 37. The modulator 38 is designed to pass on the frequency conversion products to the second part of the circulator 31 by way of the band elimination filter 30 which is designed to pass the frequency conversion products but to reject the original frequency energy. Additionally, in this embodiment, the modulator is designed to supply the energy of original frequency to the video detector 43. Typically, the detection function can be built into the balanced modulator so that the need of a video detector as a separate element is avoided. The detected information is supplied to the load 41 by way of the delay element 44 which inserts a delay sufficient to insure substantial coincidence of the arrival of the outputs of detectors 36 and 44 at the load.

This arrangement will have essentially all of the advantages discussed for the arrangement shown in FIG. 1 and accordingly the various comments made with respect to that arrangement are similarly applicable to this.

Accordingly, it is to be understood that the specific embodiment described is merely illustrative of the general principles of the invention. Various modifications thereof may be devised by one skilled in the art without departing from the spirit and scope of the invention.

What is claimed is:

1. In combination:

a circulator having first, second, third and fourth ports;

signal frequency receiving means connected to said first port;

an amplifier connected to said third port;

a signal frequency band elimination filter connected to said second port;

said band elimination filter comprising means for reflecting signal frequency energy, whereby signal frequency energy from said receiving means is transmitted to said amplifier via said first, second and third ports;

a power divider connected to said amplifier;

a load connected to one output of said power divider and a signal frequency bandpass filter connected to another output of said power divider;

said power divider comprising means for channeling part of the output of said amplifier to said load regardless of frequency and for channeling the remaining amplifier output to said signal frequency bandpass filter;

a balanced modulator having an input end connected to said bandpass filter and an output end connected to band elimination filter;

and a source of local oscillator frequency energy connected to said balanced modulator;

said balanced modulator comprising means for establishing an upper sideband frequency which is equal to the sum of said signal and local oscillator frequencies and a lower sideband frequency which is equal to the difference of said signal and local oscillator frequencies;

said band elimination filter further comprising means for conducting both said upper and lower sideband frequencies to the second port of said circulator.

2. The combination of claim 1 wherein said receiving means comprises an antenna;

and further comprising a radio frequency transmitter connected to the fourth port of the circulator, whereby said antenna is capable of radiating energy transmitted by said transmitter via said fourth and first ports.

3. A radio frequency receiver comprising:

means for receiving incoming signal frequency energy;

an amplifier having an input and an output for amplifying said signal energy;

a load;

a feedback circuit;

means for channeling part of the output energy of said amplifier to said load regardless of its frequency and for channeling the remaining amplifier output energy to said feedback circuit;

said feedback circuit comprising a source of local oscillator frequency energy;

means included in said feedback circuit for establishing an upper sideband frequency and a lower sideband frequency;

said upper sideband frequency being equal to the sum of said signal and local oscillator frequencies and said lower sideband frequency being equal to the difference of said signal and local oscillator frequencies;

and means for channeling both said upper and lower sideband frequencies to the input of said amplifier.

4. In combination:

means for receiving signal frequency energy;

an amplifier;

a source of local oscillator frequency energy;

a balanced modulator coupled to said source for establishing an upper sideband frequency that is equal to the sum of the signal and local oscillator frequencies and a lower sideband frequency that is equal to the sum of the signal and local oscillator frequencies;

a circulator having first, second, third and fourth ports;

said receiving means being connected to the first port;

said amplifier being connected to the third port;

a signal frequency band elimination filter connected to said balanced modulator and said second port;

said filter comprising means for conducting upper and lower sideband frequency energy to said second port and for reflecting signal frequency energy back to said second port, whereby said upper and lower sideband frequencies and said signal frequency are transmitted via said third port to said amplifier;

a power divider connected to the output of said amplifier;

a load connected to a first output of said power divider;

and a filter having a pass-band at said signal frequency being connected to one output of said power divider and to said balanced modulator.

5. In combination:

a circulator having first, second, third, and fourth ports;

signal frequency receiving means connected to said first port, an amplifier connected to said third port;

a signal frequency band elimination filter connected to said second port;

said band elimination filter comprising means for reflecting signal frequency energy, whereby signal frequency energy from said receiving means is transmitted to said amplifier via said first, second and third ports;

a power divider connected to said amplifier;

a load connected to one output of said power divider and a signal frequency bandpass filter connected to another output of said power divider;

said power divider comprising means for channeling part of the output of said amplifier to said load regardless of frequency and for channeling the remaining amplifier output to said signal frequency bandpass filter;

a frequency converter having an input end connected to said bandpass filter and an output end connected to said band elimination filter;

said frequency converter comprising means for establishing a sideband frequency which is different from said signal frequency;

said band elimination filter comprising means for conducting said sideband frequency to the second port of said circulator.

6. The combination of claim 5 wherein said receiving means comprises an antenna;

and further comprising a radio frequency transmitter connected to the fourth port of the circulator, whereby said antenna is capable of radiating energy transmitted by said transmitter via said fourth and first ports.

References Cited in the file of this patent

UNITED STATES PATENTS

| | | |
|---|---|---|
| 2,674,692 | Cutler | Apr. 6, 1954 |
| 2,770,722 | Arams | Nov. 13, 1956 |
| 2,784,381 | Budenbom | Mar. 5, 1957 |
| 2,890,328 | Fox | June 9, 1959 |